(12) United States Patent
Fukudome et al.

(10) Patent No.: US 11,990,894 B2
(45) Date of Patent: May 21, 2024

(54) SEMICONDUCTOR ELEMENT DRIVING CIRCUIT AND SEMICONDUCTOR ELEMENT DRIVING DEVICE

(71) Applicant: Mitsubishi Electric Corporation, Tokyo (JP)

(72) Inventors: Jun Fukudome, Tokyo (JP); Kazuya Hokazono, Tokyo (JP); Mitsutaka Hano, Tokyo (JP); Yuki Terado, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 6 days.

(21) Appl. No.: 17/830,132

(22) Filed: Jun. 1, 2022

(65) Prior Publication Data

US 2023/0076712 A1  Mar. 9, 2023

(30) Foreign Application Priority Data

Sep. 6, 2021 (JP) .................................. 2021-144775

(51) Int. Cl.
*H03K 17/081* (2006.01)
*H03K 17/16* (2006.01)

(52) U.S. Cl.
CPC ..... *H03K 17/08104* (2013.01); *H03K 17/163* (2013.01); *H03K 17/168* (2013.01)

(58) Field of Classification Search
CPC ........... H03K 17/08104; H03K 17/163; H03K 17/168
See application file for complete search history.

(56) References Cited

U.S. PATENT DOCUMENTS

| 5,390,070 | A | * | 2/1995 | Niedermeier | H03K 17/0822 361/152 |
| 7,710,187 | B2 | * | 5/2010 | Hiyama | H03K 17/74 327/434 |
| 8,085,083 | B2 | * | 12/2011 | Zhang | H03K 17/145 327/427 |
| 8,994,414 | B2 | * | 3/2015 | Sugahara | H03K 17/16 327/112 |
| 10,218,351 | B2 | * | 2/2019 | Shinomiya | H03K 17/127 |
| 11,165,422 | B2 | * | 11/2021 | Zhou | H03K 17/689 |
| 11,417,648 | B2 | * | 8/2022 | Suh | H02K 11/33 |
| 2011/0241738 | A1 | * | 10/2011 | Tamaoka | H03K 17/145 327/109 |
| 2017/0019097 | A1 | | 1/2017 | Sato | |

FOREIGN PATENT DOCUMENTS

| JP | 2002016486 A | * | 1/2002 |
| JP | 2017-028779 A | | 2/2017 |

* cited by examiner

*Primary Examiner* — Ryan Johnson
*Assistant Examiner* — Colleen J O Toole
(74) *Attorney, Agent, or Firm* — Studebaker & Brackett PC

(57) ABSTRACT

A semiconductor device includes a first switch and a first driver. The first switch selects and outputs one of a power supply potential and a generated potential as a first switch output potential based on a synchronization signal from a transmission circuit and a delayed signal delayed from the synchronization signal. The first driver charges a gate of a bipolar transistor element based on the synchronization signal of the transmission circuit and the first switch output potential.

9 Claims, 13 Drawing Sheets

F I G. 4
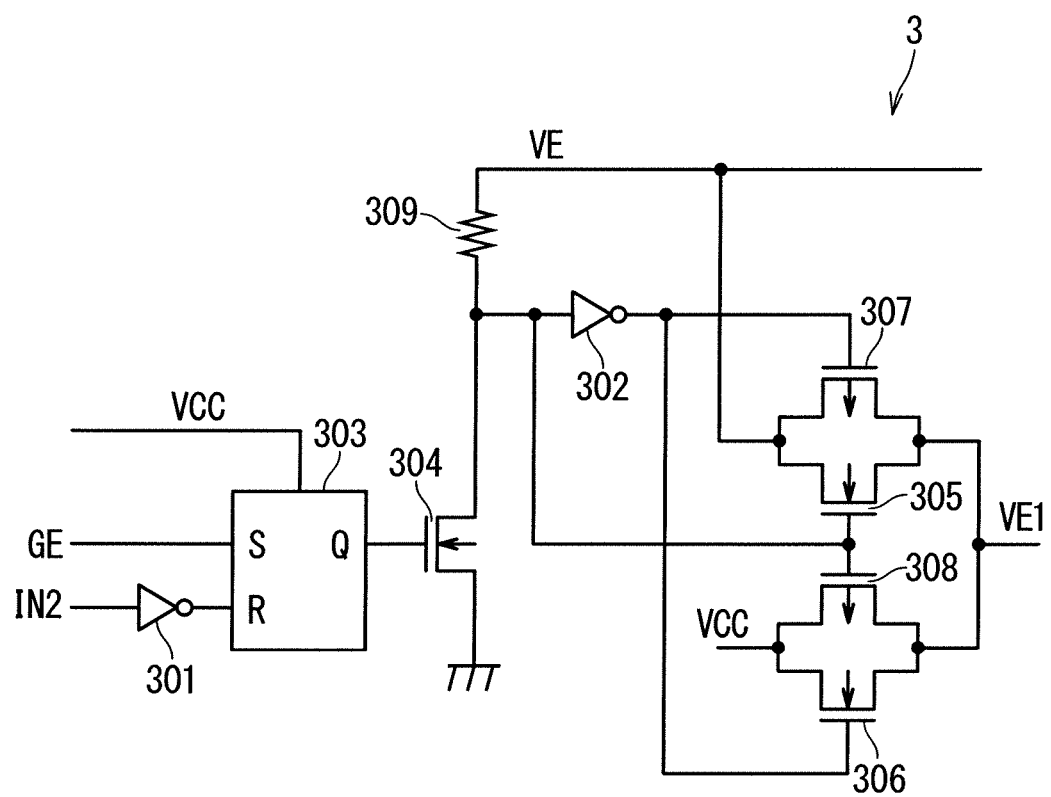

SEMICONDUCTOR ELEMENT DRIVING CIRCUIT AND SEMICONDUCTOR ELEMENT DRIVING DEVICE

BACKGROUND OF THE INVENTION

Field of the Invention

The present disclosure relates to a semiconductor element driving circuit and a semiconductor element driving device.

Description of the Background Art

As a technique of driving a semiconductor element, a technique of driving the semiconductor element has been proposed in which power transistors having different performances are combined in order to improve the performance. For example, the technique of driving the semiconductor element obtained by combining a metal oxide semiconductor field effect transistor (MOSFET) that is a unipolar transistor element and an insulated gate bipolar transistor (IGBT) that is a bipolar transistor element has been proposed.

In the driving, the IGBT affects short circuit tolerance. Therefore, in order to increase the short circuit tolerance, a technique has been proposed in which a gate voltage on the IGBT side is made lower than a gate voltage on the MOSFET side (for example, Japanese Patent Application Laid-Open No. 2017-028779).

However, there is a trade-off relationship between increasing the short circuit tolerance and reducing the switching loss. Therefore, there is a problem that the switching loss becomes high, if the gate voltage on the IGBT side is constantly lowered to increase the short circuit tolerance while the IGBT is on.

SUMMARY

The present disclosure has been made in view of the above problems, and an object of the present disclosure is to provide a technique capable of reducing switching loss and increasing the short circuit tolerance.

The semiconductor element driving circuit according to the present disclosure is a semiconductor element driving circuit that drives a bipolar transistor element and a unipolar transistor element, and includes: a transmission circuit that generates a synchronization signal synchronized with an input signal based on the input signal; a potential generation circuit that generates a potential different from a power supply potential as a generated potential based on the power supply potential; a first switch that selects and outputs one of the power supply potential and the generated potential as a first switch output potential, based on the synchronization signal from the transmission circuit and a delayed signal delayed from the synchronization signal; a first driver that charges a gate of the bipolar transistor element based on the synchronization signal of the transmission circuit and the first switch output potential; and a second driver that charges a gate of the unipolar transistor element based on the synchronization signal of the transmission circuit and one of the power supply potential and the generated potential.

The switching loss can be reduced, and the short circuit tolerance can be increased.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 4 is a circuit diagram illustrating a configuration example of a first power supply changeover switch;

DESCRIPTION OF THE PREFERRED EMBODIMENTS

Figure 1:
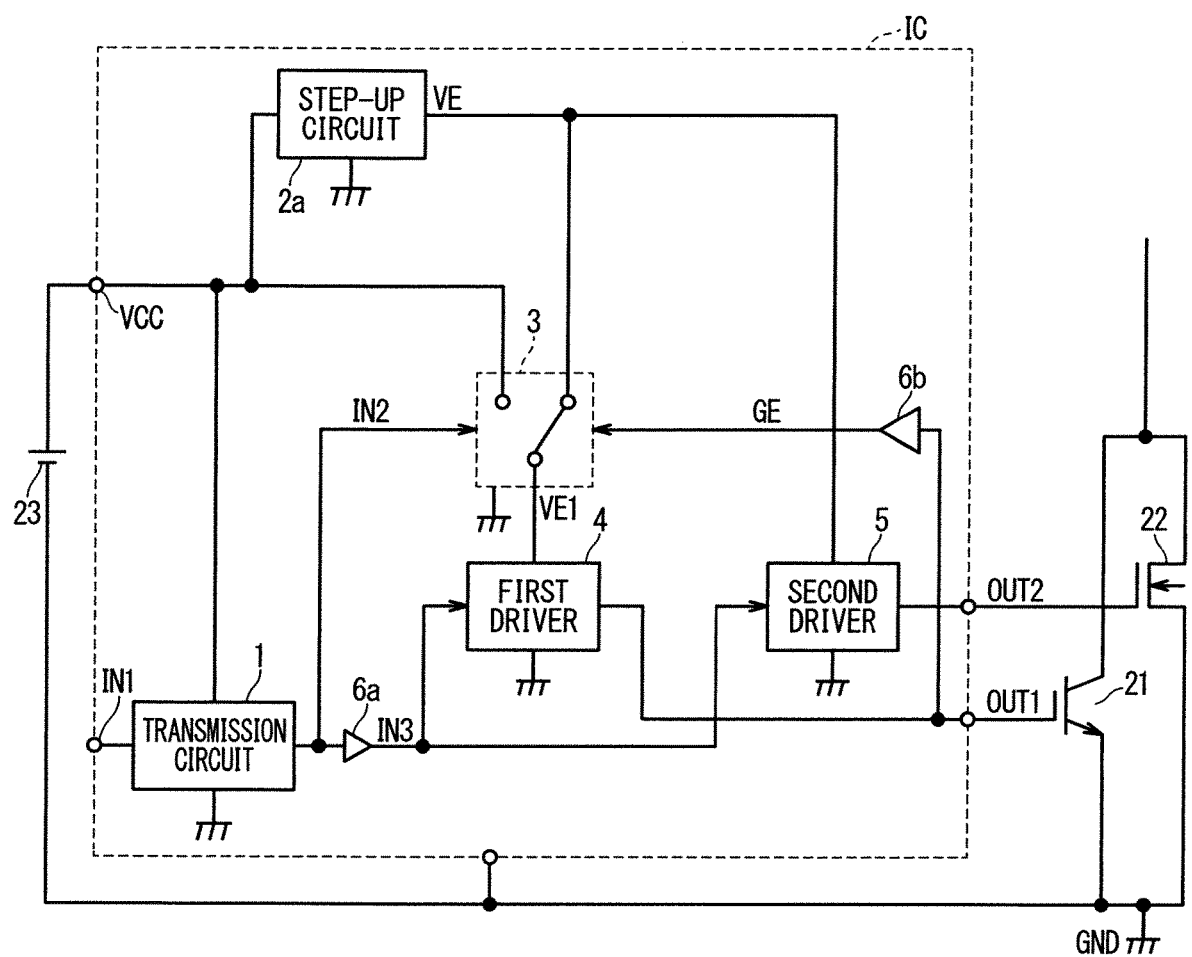
FIG. 1 is a circuit block diagram illustrating a configuration of a semiconductor element driving circuit according to a first preferred embodiment.

Hereinafter, preferred embodiments will be described with reference to the accompanying drawings. Features described in the following preferred embodiments are examples, and all features are not necessarily essential. Further, in the following description, similar components in the preferred embodiments are denoted by the same or similar reference numerals, and different components will be mainly described. Furthermore, in the following description, specific positions and directions such as "upper", "lower", "left", "right", "front", or "back" may not necessarily coincide with positions and directions at the time of actual implementation.

First Preferred Embodiment

Figure 2:
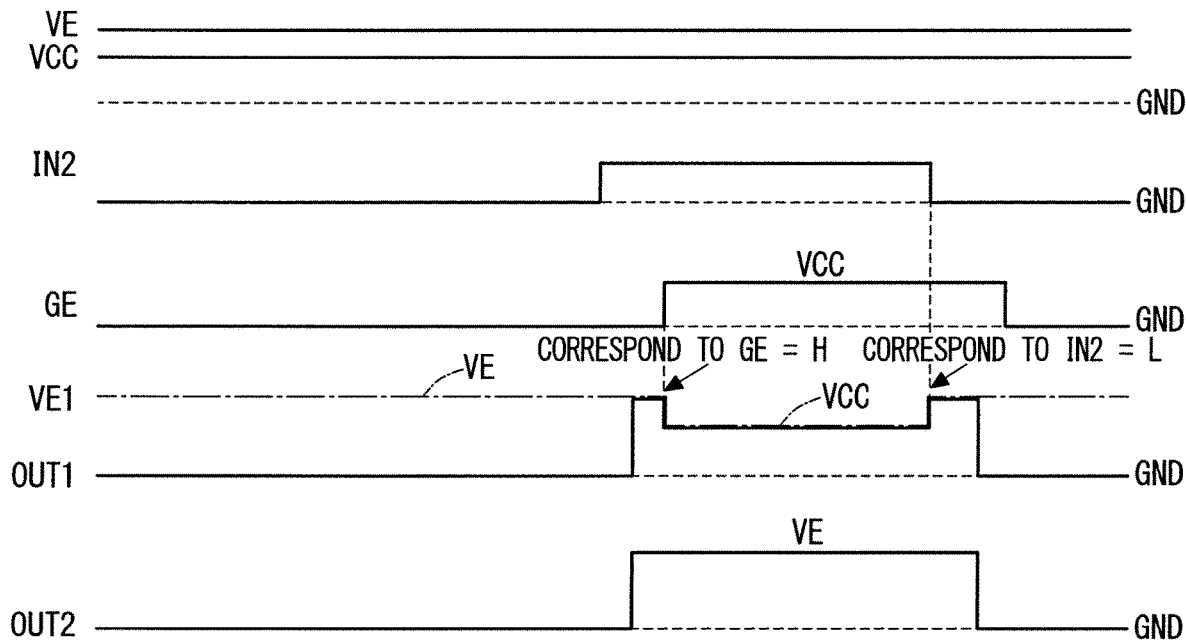
FIG. 2 is a timing chart illustrating an operation sequence of the semiconductor element driving circuit according to the first preferred embodiment.

FIG. 1 is a circuit block diagram illustrating a configuration of a semiconductor element driving circuit IC according to a first preferred embodiment. FIG. 2 is a timing chart illustrating an operation sequence of the semiconductor element driving circuit IC.

The semiconductor element driving circuit IC of FIG. 1 outputs output signals OUT1 and OUT2 to a gate of an IGBT 21 which is a bipolar transistor element and a gate of an MOSFET 22 which is a unipolar transistor element, based on an input signal IN1 and a power supply potential VCC of an external power supply 23. Thus, the semiconductor element driving circuit IC drives the IGBT 21 and the MOSFET 22.

Note that the IGBT 21 and the MOSFET 22 are connected in parallel between a semiconductor switching element (not illustrated) or a power supply (not illustrated) and a semiconductor switching element (not illustrated) or a ground potential GND. The material of the IGBT 21 and the MOSFET 22 may contain normal silicon (Si), or may contain a wide band gap semiconductor such as silicon carbide (SiC), gallium nitride (GaN), or diamond. When the IGBT 21 and the MOSFET 22 are made of the wide band gap semiconductor, it is possible to stabilize operation under high temperature and high voltage and to increase switching speed.

The semiconductor element driving circuit IC of FIG. 1 includes a transmission circuit 1, a step-up circuit 2a, a first power supply changeover switch 3 that is a first switch, a first driver 4, a second driver 5, and buffers 6a and 6b.

The transmission circuit 1 generates a synchronization signal IN2 synchronized with the input signal IN1 based on the input signal IN1, and having the power supply potential VCC as a high-level potential. The synchronization signal IN2 is input to the first power supply changeover switch 3 and is input to the first driver 4 and the second driver 5 via the buffer 6a. A synchronization signal IN3 generated by the buffer 6a is synchronized with the synchronization signal IN2, and has the power supply potential VCC as the high-level potential. As described above, since the synchronization signal IN3 corresponds to the synchronization signal IN2, the synchronization signal IN2 and the synchronization signal IN3 may not be distinguished in the following description.

As illustrated in FIG. 2, the step-up circuit 2a generates a step-up potential VE higher than the power supply potential VCC as a generated potential. The step-up circuit 2a, which is a potential generation circuit, generates a potential different from the power supply potential VCC as the generated potential based on the power supply potential VCC.

The power supply potential VCC, the step-up potential VE, the synchronization signal IN2, and a signal GE which is a delayed signal delayed from the synchronization signal IN2 are input to the first power supply changeover switch 3 of FIG. 1. As illustrated in FIG. 2, the signal GE generated by the buffer 6b is synchronized with a gate signal from the gate of the IGBT 21, that is, the output signal OUT1 from the first driver 4, and has the power supply potential VCC as the high-level potential. In this way, since the signal GE corresponds to the gate signal, the signal GE and the gate signal may not be distinguished in the following description.

The first power supply changeover switch 3 selects and outputs one of the power supply potential VCC and the step-up potential VE which is the generated potential as a first switch output potential VE1, based on the synchronization signal IN2 from the transmission circuit 1 and the signal GE which is the delayed signal.

The first driver 4 charges the gate of the IGBT 21 by outputting the output signal OUT1 to the gate of the IGBT 21, based on the synchronization signal IN3 (that is, the synchronization signal IN2) and the first switch output potential VE1. The second driver 5 charges the gate of the MOSFET 22 by outputting the output signal OUT2 to the gate of the MOSFET 22 based on the synchronization signal IN3 (that is, the synchronization signal IN2) and the step-up potential VE which is the generated potential.

The first power supply changeover switch 3, the first driver 4, and the second driver 5 will be described in detail with reference to FIG. 2.

The first switch output potential VE1 of the first power supply changeover switch 3 corresponds to a one-dot chain line added to the output signal OUT1 of FIG. 2. When the synchronization signal IN2 is at a high level and the signal GE is at a high level, the first power supply changeover switch 3 outputs the power supply potential VCC as the first switch output potential VE1. Otherwise, the first power supply changeover switch 3 outputs the step-up potential VE as the first switch output potential VE1.

The first driver 4 outputs the first switch output potential VE1 as the output signal OUT1 when the synchronization signal IN3 is at a high level, and outputs the low level output signal OUT1 when the synchronization signal IN3 is at a low level. Note that the output signal OUT1 is delayed from the synchronization signal IN2 by a transmission delay time of the first driver 4, and the signal GE is delayed from the output signal OUT1 by a transmission delay time of the buffer 6b. The transmission delay times of the first driver 4 and the buffer 6b are preferably as close as possible to zero.

As a result of the above operation, when the first driver 4 starts charging the gate of the IGBT 21, the first power supply changeover switch 3 outputs a higher step-up potential VE of the power supply potential VCC and the step-up potential VE, as the first switch output potential VE1. Thereafter, the first power supply changeover switch 3 outputs a lower power supply potential VCC of the power supply potential VCC and the step-up potential VE, as the first switch output potential VE1. That is, as illustrated in FIG. 2, the first power supply changeover switch 3 switches the first switch output potential VE1 from the step-up potential VE to the power supply potential VCC with a transition of the signal GE from the low level to the high level as a trigger. Then, the first power supply changeover switch 3 switches the first switch output potential VE1 from the power supply potential VCC to the step-up potential VE with a transition of the synchronization signal IN2 from the high level to the low level as a trigger.

The second driver 5 outputs the step-up potential VE as the output signal OUT2 when the synchronization signal IN3 is at the high level, and outputs the low level output signal OUT2 when the synchronization signal IN3 is at the low level.

<Configuration Example of Step-Up Circuit 2a>

Figure 3:
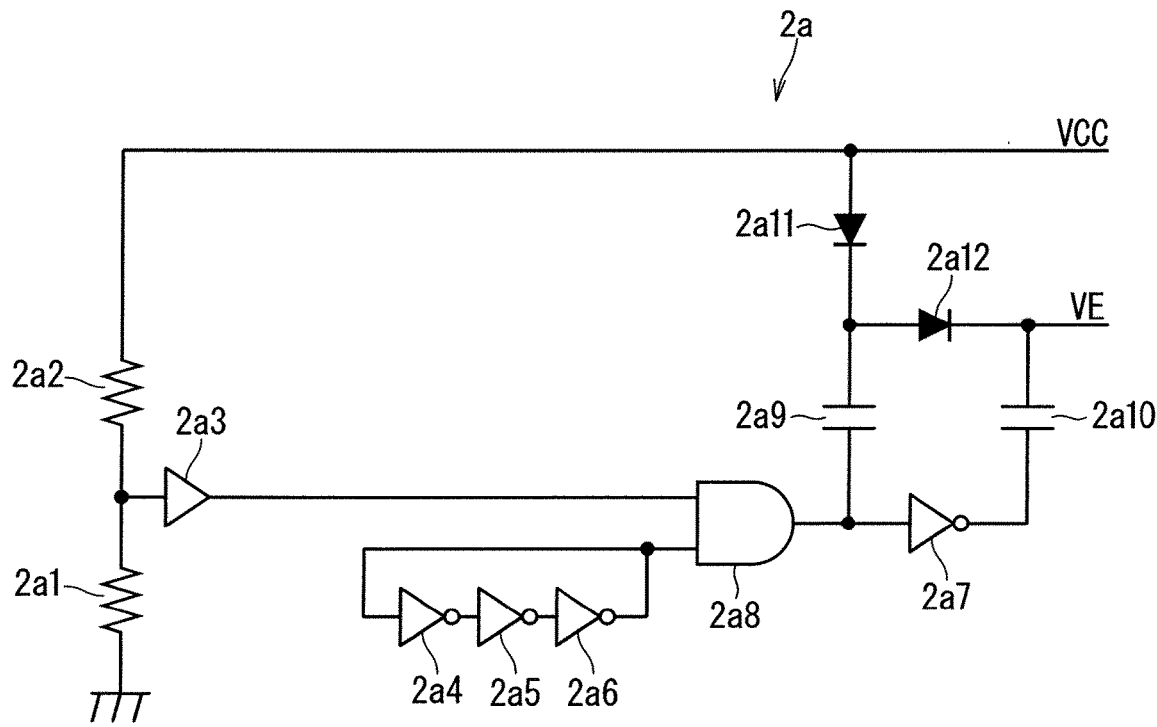
FIG. 3 is a circuit diagram illustrating a configuration example of a step-up circuit.

FIG. 3 is a circuit diagram illustrating a configuration example of the step-up circuit 2a. The step-up circuit 2a includes resistors 2a1 and 2a2, a buffer 2a3, inverters 2a4, 2a5, 2a6, and 2a7, an AND circuit 2a8, capacitors 2a9 and 2a10, and diodes 2a11 and 2a12.

The resistors 2a1 and 2a2 and the buffer 2a3 constitute a power-on reset circuit, and when a potential obtained by dividing the power supply potential VCC by the resistors 2a1 and 2a2 is equal to or higher than a threshold of the buffer 2a3, the buffer 2a3 outputs a high level signal.

The inverters 2a4, 2a5, and 2a6 constitute a ring oscillator which is a general oscillation circuit, and outputs a continuous pulse including a plurality of pulses having a period and a pulse width corresponding to transmission delay times and thresholds of the inverters 2a4, 2a5, and 2a6.

The AND circuit 2a8 outputs the continuous pulse generated by the inverters 2a4, 2a5, and 2a6, only while the buffer 2a3 outputs the high level signal.

The inverter 2a7, the capacitors 2a9 and 2a10, and the diodes 2a11 and 2a12 constitute a charge pump which is a general step-up circuit. The capacitor 2a9 connected to the power supply potential VCC via the diode 2a11 repeats charging and discharging by the continuous pulse output from the AND circuit 2a8. By repeating the charging and discharging, the capacitor 2a10 connected to the capacitor 2a9 via the inverter 2a7 and the diode 2a12 is charged to generate the step-up potential VE. Note that the step-up potential VE generated in this case is expressed as VE=3× VCC−2×VF by the power supply potential VCC and a forward voltage VF when forward voltages of the diodes 2a11 and 2a12 are VF.

<Configuration Example of First Power Supply Changeover Switch 3>

FIG. 4 is a circuit diagram illustrating a configuration example of a first power supply changeover switch 3. The first power supply changeover switch 3 includes inverters 301 and 302, an SR-FF circuit 303, NMOSs 304, 305, and 306, PMOSs 307 and 308, and a resistor 309.

The SR-FF circuit 303 is driven by the power supply potential VCC, the signal GE is input to the set side of the SR-FF circuit 303, and the synchronization signal IN2 is input to the reset side of the SR-FF circuit 303 via the inverter 301.

The NMOS 304 and the resistor 309 constitute a level shift circuit, and invert an output signal from the SR-FF circuit 303 and level-shift the high-level potential from the power supply potential VCC to the step-up potential VE.

The inverter 302, the NMOSs 305 and 306, and the PMOSs 307 and 308 constitute an analog switch. When a drain signal of the NMOS 304 transitions from the high level to the low level, the analog switch switches the first switch output potential VE1 from the step-up potential VE to the power supply potential VCC. On the other hand, when the drain signal of the NMOS 304 transitions from the low level to the high level, the analog switch switches the first switch output potential VE1 from the power supply potential VCC to the step-up potential VE.

<Configuration Example of First Driver 4 and Second Driver 5>

The first driver 4 and the second driver 5 include, for example, an inverter including the PMOS and the NMOS.

Summary of First Preferred Embodiment

According to the semiconductor element driving circuit IC of the first preferred embodiment, the first power supply changeover switch 3 selects and outputs one of the power supply potential VCC and the generated potential (for example, the step-up potential VE) as the first switch output potential VE1 based on the synchronization signal IN2 from the transmission circuit 1 and the delayed signal (for example, the signal GE). According to such a configuration, when charging of the gate of the IGBT 21 is started, the gate is charged based on the step-up potential VE which is the generated potential higher than the power supply potential VCC, so that switching loss can be reduced. Thereafter (that is, at the time of DC driving), the gate is charged based on the power supply potential VCC lower than the step-up potential VE, so that short circuit tolerance can be increased.

Modification of First Preferred Embodiment

In the first preferred embodiment, the delayed signal is the signal GE, that is, the gate signal from the gate of the IGBT 21, but is not limited to this. For example, the delayed signal may be a signal obtained by delaying the synchronization signal IN2 by a delay circuit (not illustrated).

Further, in the first preferred embodiment, the step-up circuit 2a may be configured to perform step-up only in a period in which the first driver 4 charges the gate of the IGBT 21. According to such a configuration, power consumption in the step-up circuit 2a can be reduced.

Further, in the first preferred embodiment, the potential generation circuit that generates a potential different from the power supply potential VCC as the generated potential based on the power supply potential VCC is the step-up circuit 2a. However, the potential generation circuit is not limited to this, and may be a step-down circuit as described in a preferred embodiment below.

Second Preferred Embodiment

Figure 5:
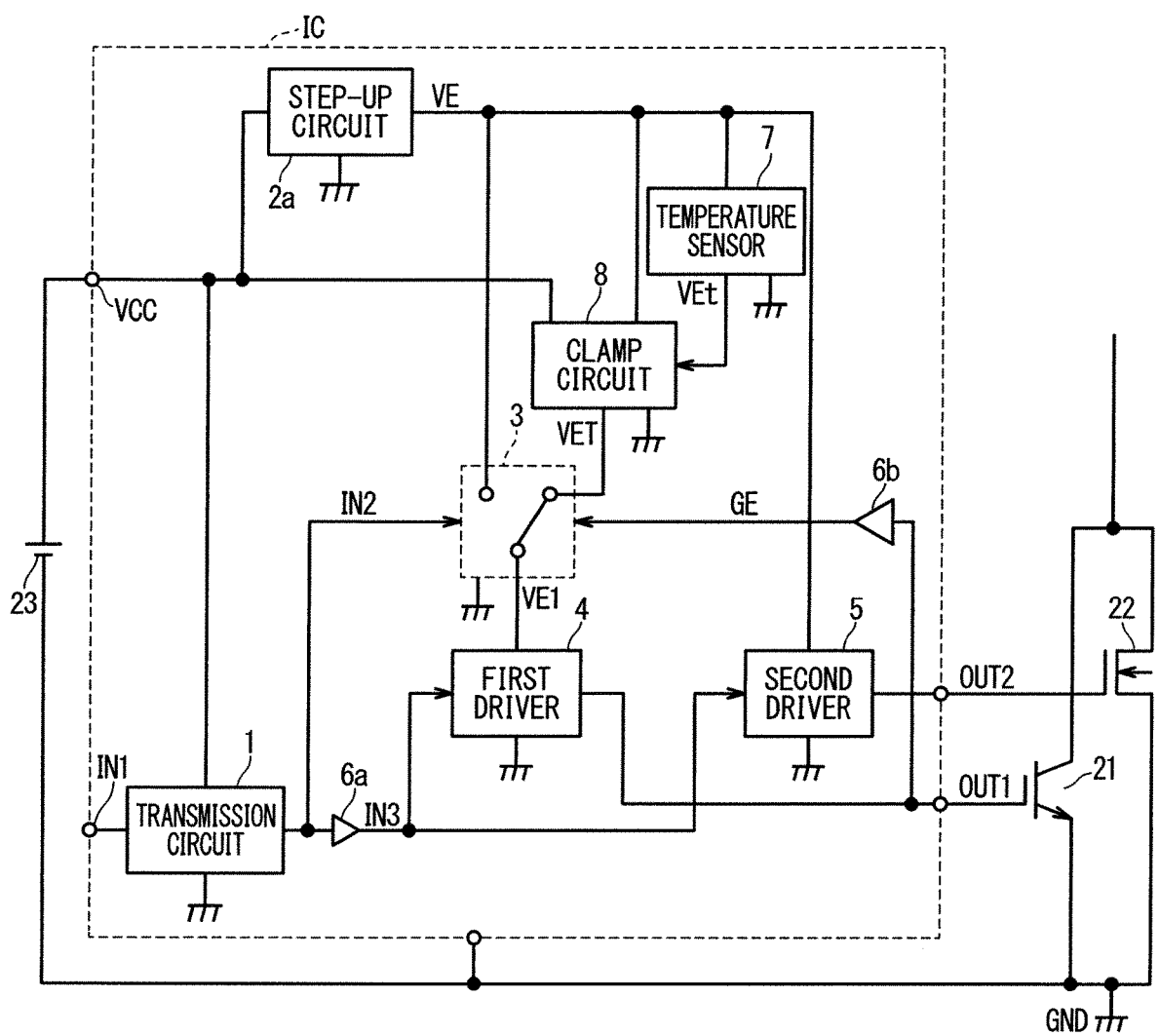
FIG. 5 is a circuit block diagram illustrating the configuration of the semiconductor element driving circuit according to a second preferred embodiment.
Figure 6:
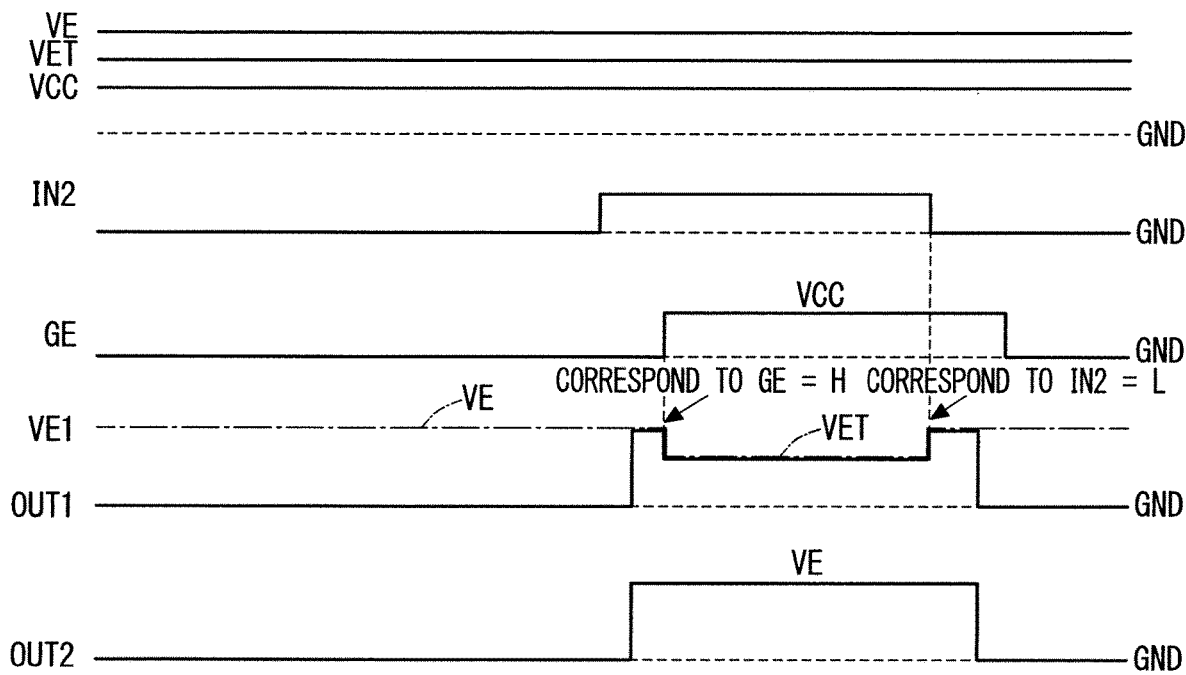
FIG. 6 is a timing chart illustrating the operation sequence of the semiconductor element driving circuit according to the second preferred embodiment.

FIG. 5 is a circuit block diagram illustrating the configuration of the semiconductor element driving circuit IC according to a second preferred embodiment. FIG. 6 is a timing chart illustrating the operation sequence of the semiconductor element driving circuit IC. The configuration of the semiconductor element driving circuit IC of FIG. 5 is similar to a configuration in which a temperature sensor 7 and a clamp circuit 8 are added to the configuration of the semiconductor element driving circuit IC of FIG. 1.

The temperature sensor 7 outputs a potential, that is lower than the step-up potential VE and has negative temperature dependency, as a sensor output potential VEt, based on a temperature of the semiconductor element driving circuit IC. The temperature of the semiconductor element driving circuit IC herein includes a temperature inside the semiconductor element driving circuit IC or a temperature around the semiconductor element driving circuit IC. Depending on the temperature of the semiconductor element driving circuit IC, the temperature sensor 7 may output the same potential as the step-up potential VE as the sensor output potential VEt.

When the sensor output potential VEt is equal to or higher than the power supply potential VCC, the clamp circuit 8 outputs the sensor output potential VEt as an output potential VET. On the other hand, when the sensor output potential VEt is smaller than the power supply potential VCC, the clamp circuit 8 outputs the power supply potential VCC as the output potential VET. Therefore, in the second preferred embodiment, the output potential VET is equal to or higher than the power supply potential VCC and equal to or lower than the step-up potential VE.

Figure 7:
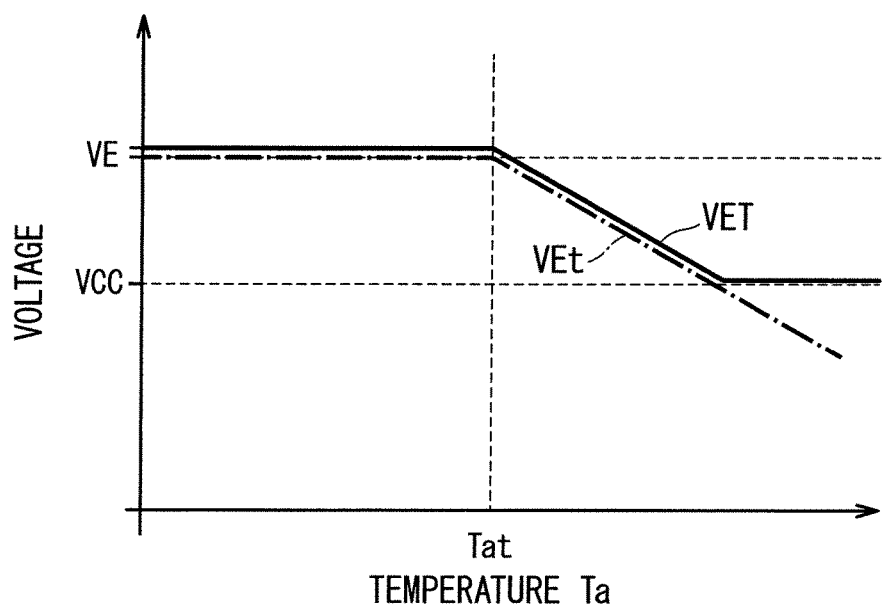
FIG. 7 is a diagram illustrating temperature dependency of a sensor output potential and an output potential according to the second preferred embodiment.

FIG. 7 is a diagram illustrating temperature dependency of the sensor output potential VEt and the output potential VET according to the second preferred embodiment.

A one-dot chain line in FIG. 7 indicates the sensor output potential VEt. Regarding a temperature Ta of the semiconductor element driving circuit IC and its threshold temperature Tat, when Ta<Tat, VEt=VE. On the other hand, when Ta≥Tat, the sensor output potential VEt has the negative temperature dependency that decreases as the temperature Ta increases, and thus VEt<VE.

A solid line in FIG. 7 indicates the output potential VET generated by the clamp circuit 8. When VEt≥VCC, VET=VEt, and when VEt<VCC, VET=VCC.

As illustrated in FIGS. 5 and 6, the first power supply changeover switch 3 selects and outputs one of the output potential VET and the step-up potential VE as the first switch output potential VE1 based on the synchronization signal IN2 from the transmission circuit 1 and the signal GE. In the second preferred embodiment, the first power supply changeover switch 3 switches the first switch output potential VE1 from the step-up potential VE to the output potential VET with the transition of the signal GE from the low level to the high level as the trigger. Then, the first power supply changeover switch 3 switches the first switch output potential VE1 from the output potential VET to the step-up potential VE with the transition of the synchronization signal IN2 from the high level to the low level as the trigger.

<Configuration Example of Temperature Sensor 7>

Figure 8:
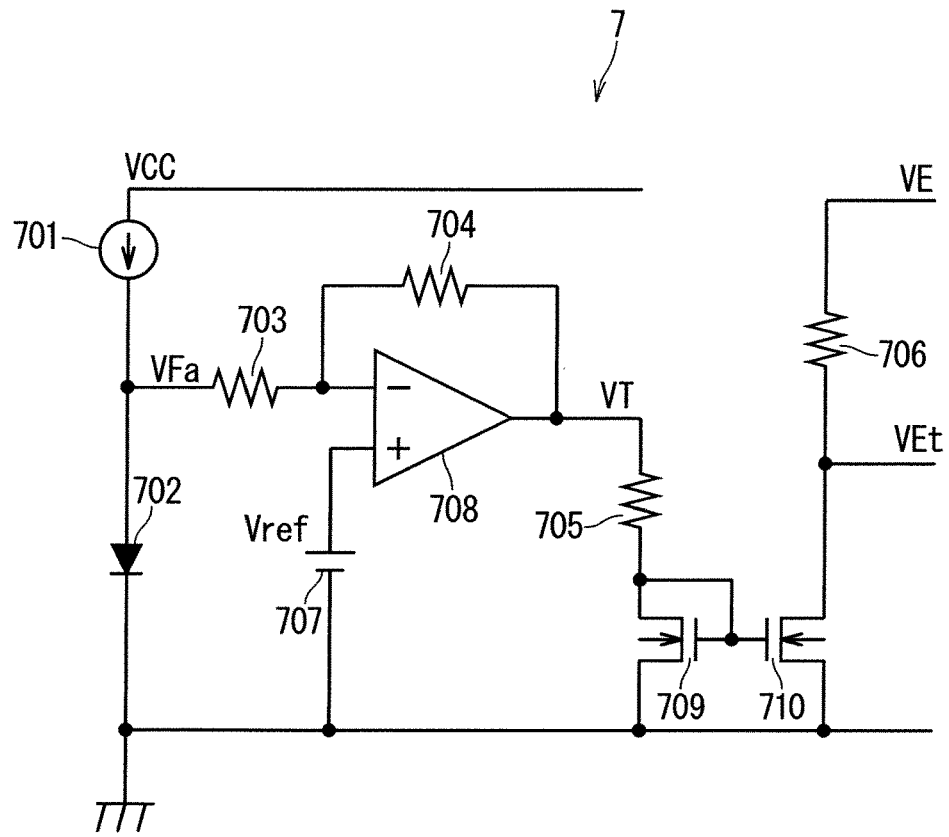
FIG. 8 is a circuit diagram illustrating a configuration example of a temperature sensor.

FIG. 8 is a circuit diagram illustrating a configuration example of the temperature sensor 7. The temperature sensor 7 includes a constant current source 701, a diode 702, resistors 703, 704, 705, and 706, a power supply 707, an operational amplifier 708, and NMOSs 709 and 710.

The constant current source 701 connected to the power supply potential VCC causes a constant current to flow through the diode 702, and thus a forward voltage is generated in the diode 702. The operational amplifier 708 using the power supply potential VCC as the power supply potential and the resistors 703 and 704 constitute an inverting amplifier circuit, and invert and amplify an anode potential VFa of the diode 702 with a potential Vref of the power supply 707 as a reference potential. When the anode potential VFa has the negative temperature dependency that decreases as the temperature increases, an output potential VT of the operational amplifier 708 has positive temperature dependency. The resistor 705 and the NMOSs 709 and 710 increase a current flowing through the resistor 706 connected between the NMOS 710 and the step-up potential VE as the output potential VT increases. Thus, a potential at a connection point between the resistor 706 and the NMOS 710 is generated as the sensor output potential VEt having the negative temperature dependency.

<Configuration Example of Clamp Circuit 8>

Figure 9:
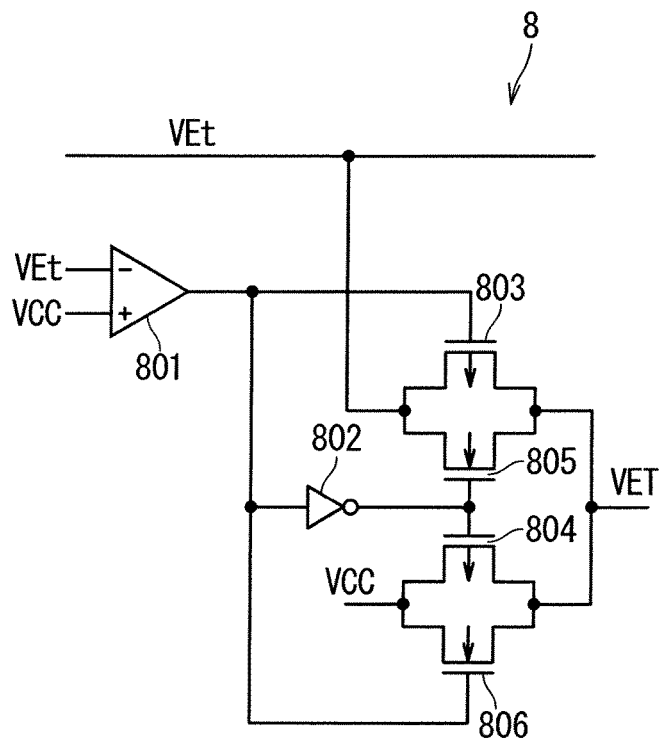
FIG. 9 is a circuit diagram illustrating a configuration example of a clamp circuit.

FIG. 9 is a circuit diagram illustrating a configuration example of the clamp circuit 8. The clamp circuit 8 includes an operational amplifier 801, an inverter 802, PMOSs 803 and 804, and NMOSs 805 and 806. The operational amplifier 801 constitutes a comparator having the step-up potential VE as the power supply potential, and outputs the high level signal when the sensor output potential VEt is lower than the power supply potential VCC used as the reference potential, and outputs a low level signal otherwise. The inverter 802, the PMOSs 803 and 804, and the NMOSs 805 and 806 constitute an analog switch. When the operational amplifier 801 outputs the high level signal, the analog switch switches the output potential VET from the sensor output potential VEt to the power supply potential VCC. On the other hand, when the operational amplifier 801 outputs the low level signal, the analog switch switches the output potential VET from the power supply potential VCC to the sensor output potential VEt.

Summary of Second Preferred Embodiment

In general, the short circuit tolerance of the IGBT deteriorates as the temperature increases. On the other hand, according to the semiconductor element driving circuit IC of the second preferred embodiment, the charging of the gate of the IGBT 21 can be reduced as the temperature increases, so that the short circuit tolerance of the IGBT 21 can be increased.

Modification of Second Preferred Embodiment

When the short circuit tolerance of the semiconductor switching element driven by the semiconductor element driving circuit IC deteriorates as the temperature decreases, if the sensor output potential VEt is configured to have the positive temperature dependency with respect to the temperature Ta, the short circuit tolerance can be increased. Further, when the sensor output potential VEt does not need to be clamped to the power supply potential VCC, the clamp circuit 8 is not necessary, and thus the sensor output potential VEt may be directly input to the first power supply changeover switch 3. Furthermore, a clamp potential of the clamp circuit 8 is not limited to the power supply potential VCC, and may be another potential.

Third Preferred Embodiment

Figure 10:
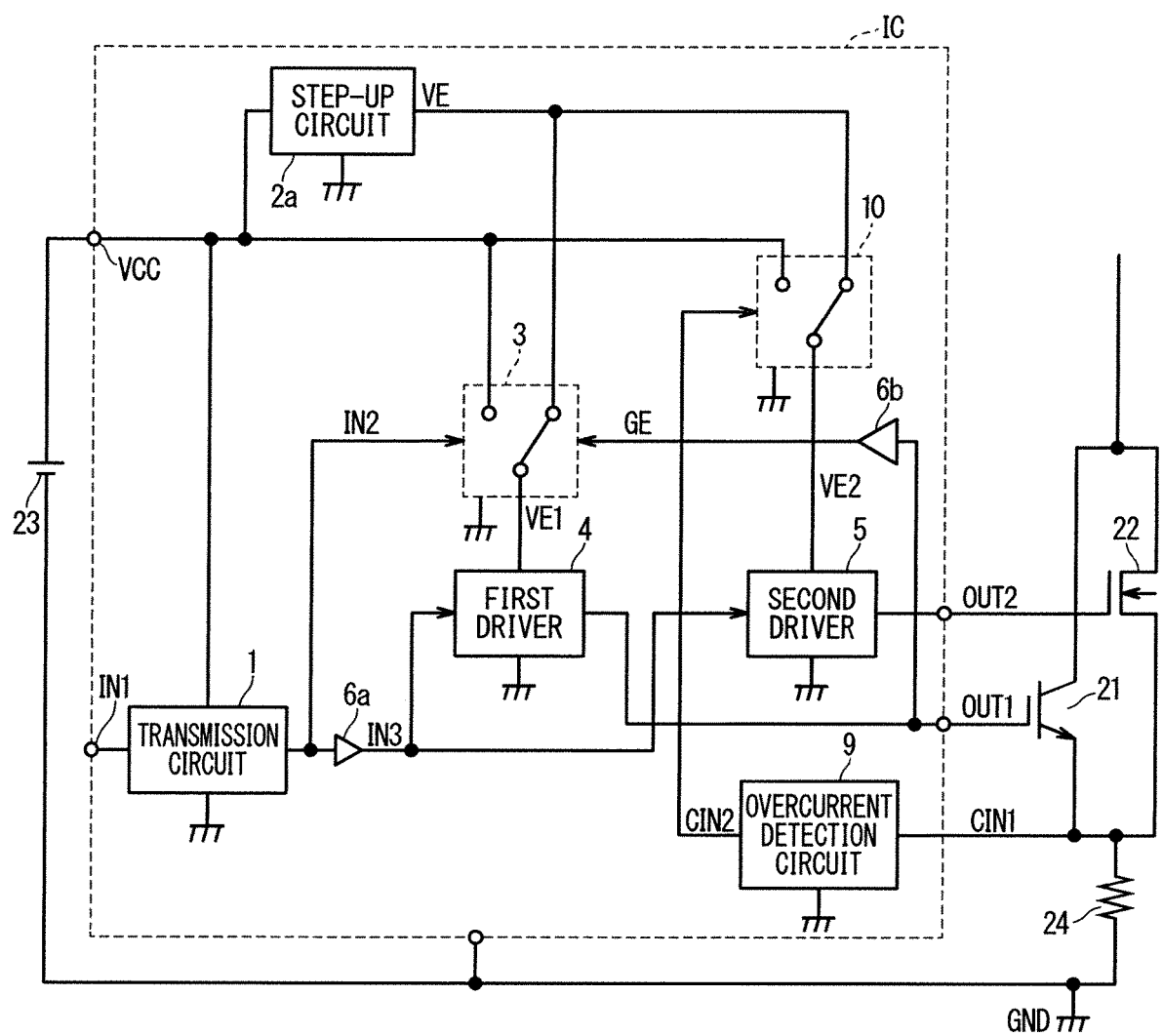
FIG. 10 is a circuit block diagram illustrating the configuration of the semiconductor element driving circuit according to a third preferred embodiment.
Figure 11:
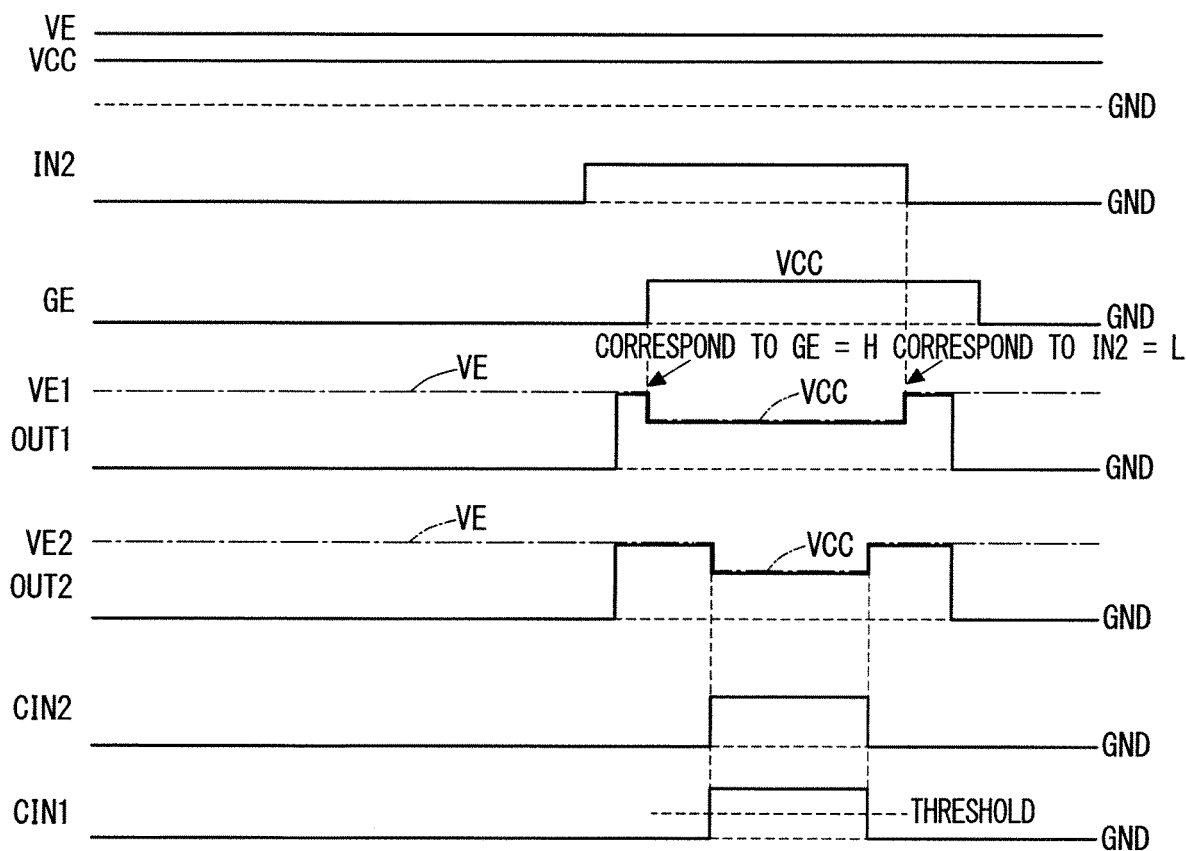
FIG. 11 is a timing chart illustrating the operation sequence of the semiconductor element driving circuit according to the third preferred embodiment.

FIG. 10 is a circuit block diagram illustrating the configuration of the semiconductor element driving circuit IC according to a third preferred embodiment. FIG. 11 is a timing chart illustrating the operation sequence of the semiconductor element driving circuit IC. The configuration of the semiconductor element driving circuit IC of FIG. 10 is similar to a configuration in which an overcurrent detection circuit 9 and a second power supply changeover switch 10 that is a second switch are added to the configuration of the semiconductor element driving circuit IC of FIG. 1. Note that the IGBT 21 and the MOSFET 22 are connected to the ground potential GND via a resistor 24.

The overcurrent detection circuit 9 detects the presence or absence of an overcurrent in the IGBT 21 and the MOSFET 22 based on an external signal CIN1 between the IGBT 21, the MOSFET 22 and the resistor 24. The overcurrent detection circuit 9 outputs a high level signal CIN2 synchronized with the external signal CIN1 when the external signal CIN1 is equal to or larger than a preset threshold value, that is, when detecting that there is the overcurrent in the IGBT 21 and the MOSFET 22. Note that the overcurrent detection circuit 9 may include, for example, the comparator.

The power supply potential VCC, the step-up potential VE, and the signal CIN2 are input to the second power supply changeover switch 10. The second power supply changeover switch 10 selects and outputs one of the power supply potential VCC and the step-up potential VE as a second switch output potential VE2, based on the signal CIN2 which is a detection result of the overcurrent detection circuit 9.

The second driver 5 charges the gate of the MOSFET 22 by outputting the output signal OUT2 to the gate of the MOSFET 22 based on the synchronization signal IN3 (that is, the synchronization signal IN2) and the second switch output potential VE2.

The second power supply changeover switch 10 and the second driver 5 will be described in detail with reference to FIG. 11.

The second switch output potential VE2 of the second power supply changeover switch 10 corresponds to a one-dot chain line added to the output signal OUT2 of FIG. 11. The second power supply changeover switch 10 outputs the power supply potential VCC as the second switch output potential VE2 when the signal CIN2 is at a high level, and outputs the step-up potential VE as the second switch output potential VE2 when the signal CIN2 is at a low level. That is, as illustrated in FIG. 11, the second power supply changeover switch 10 switches the second switch output potential VE2 from the step-up potential VE to the power supply potential VCC with the transition of the signal CIN2 from the low level to the high level as the trigger. Similarly, the second power supply changeover switch 10 switches the second switch output potential VE2 from the power supply potential VCC to the step-up potential VE with a transition of the signal CIN2 from the high level to the low level as a trigger.

Note that a period during which the second power supply changeover switch 10 outputs the power supply potential VCC as the second switch output potential VE2 may be the same as a period during which the signal CIN2 is at the high level. In addition, by providing a delay circuit (not illustrated) between the overcurrent detection circuit 9 and the second power supply changeover switch 10, the period during which the second power supply changeover switch 10 outputs the power supply potential VCC as the second switch output potential VE2 may be longer than the period during which the signal CIN2 is at the high level.

Further, the second power supply changeover switch 10 may select and output one of the power supply potential VCC and the step-up potential VE as the second switch output potential VE2 based on the signal CIN2 from the transmission circuit 1 and the signal GE. For example, when the signal CIN2 transitions from the low level to the high level after the transition of the signal GE from the low level to the high level, the second switch output potential VE2 may be switched from the step-up potential VE to the power supply potential VCC. In addition, even if the signal CIN2 transitions from the high level to the low level when the signal GE is at the high level, the second switch output potential VE2 may maintain the power supply potential VCC, and when the signal GE transitions from the high level to the low level, the second switch output potential VE2 may be switched from the power supply potential VCC to the step-up potential VE.

The second driver 5 outputs the second switch output potential VE2 as the output signal OUT2 when the synchronization signal IN3 is at the high level, and outputs the low level output signal OUT2 when the synchronization signal IN3 is at the low level.

Summary of Third Preferred Embodiment

When the overcurrent flows through the IGBT 21 and the MOSFET 22, it is required to promptly reduce the output signals OUT1 and OUT2. However, in general, since a noise filter is provided for the overcurrent detection circuit 9, an operation of reducing the output signals is delayed by a filter time, and the overcurrent may cause a failure in the IGBT 21 and the MOSFET 22. On the other hand, according to the semiconductor element driving circuit IC of the third preferred embodiment, it is not necessary to provide such a noise filter, and a gate voltage can be promptly reduced when the overcurrent detection circuit 9 detects the overcurrent, so that the failure due to the overcurrent can be suppressed.

Modification of Third Preferred Embodiment

The semiconductor element driving circuit IC may have a function of blocking the output signals OUT1 and OUT2 when the CIN1 signal is equal to or higher than a predetermined level. Further, in a configuration in which the semiconductor element driving circuit IC includes the noise filter, the semiconductor element driving circuit IC may have a function of blocking the output signals OUT1 and OUT2 when a period during which the signal CIN2 is at the high level is equal to or longer than a predetermined time.

Fourth Preferred Embodiment

Figure 12:
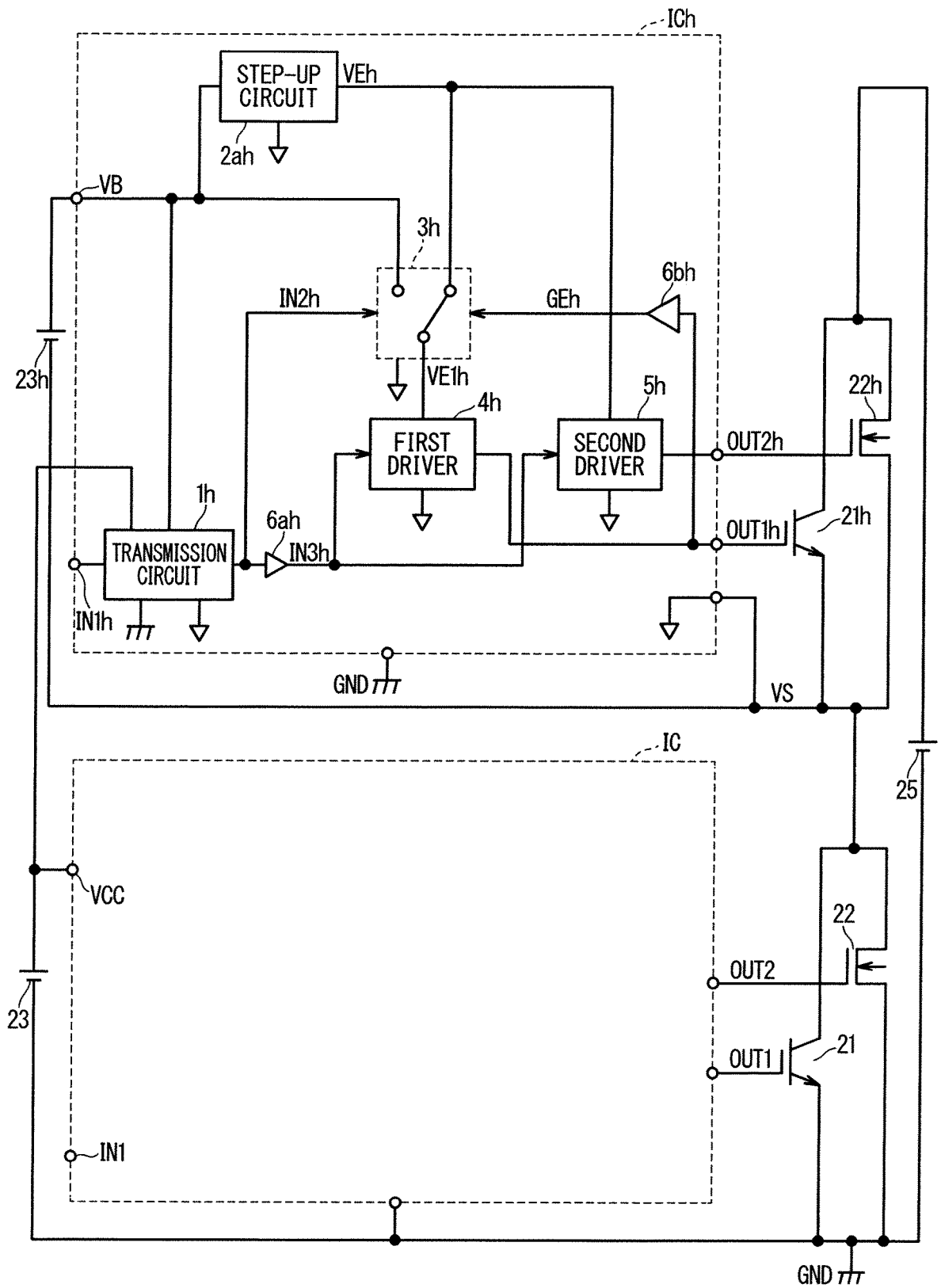
FIG. 12 is a circuit block diagram illustrating a configuration of a semiconductor element driving circuit according to a fourth preferred embodiment.

FIG. 12 is a circuit block diagram illustrating a configuration of a semiconductor element driving device according to a fourth preferred embodiment. The semiconductor element driving device of FIG. 12 includes the semiconductor element driving circuit IC of FIG. 1 described in the first preferred embodiment and a semiconductor element driving circuit ICh having a configuration similar to that of the semiconductor element driving circuit IC. Note that in the fourth preferred embodiment, since the semiconductor element driving circuit IC is similar to that of the first embodiment, a detailed configuration of the semiconductor element driving circuit IC is not illustrated in FIG. 12.

An IGBT 21$h$ and an MOSFET 22$h$ are similar to the IGBT 21 and the MOSFET 22. A series connection body of a parallel connection body of the IGBT 21 and the MOSFET 22 and a parallel connection body of the IGBT 21$h$ and the MOSFET 22$h$ is connected in parallel with a power supply 25.

The semiconductor element driving circuit IC which is a primary-side driving circuit drives the IGBT 21 and the MOSFET 22 as a lower arm of an inverter device or the like. The semiconductor element driving circuit ICh which is a secondary-side driving circuit drives the IGBT 21$h$ and the MOSFET 22$h$ as an upper arm of the inverter device or the like. That is, the semiconductor element driving circuit IC is a low voltage integrated circuit (LVIC), and the semiconductor element driving circuit ICh is a high voltage integrated circuit (HVIC). Note that in FIG. 12, the semiconductor element driving circuits IC and ICh are included in a half-bridge driver.

The semiconductor element driving circuit ICh includes components similar to those of the semiconductor element driving circuit IC, and includes a transmission circuit 1$h$, a step-up circuit 2$ah$, a first power supply changeover switch 3$h$, a first driver 4$h$, a second driver 5$h$, and buffers 6$ah$ and 6$bh$. The transmission circuit 1$h$, the step-up circuit 2$ah$, the first power supply changeover switch 3$h$, the first driver 4$h$, the second driver 5$h$, and the buffers 6$ah$ and 6$bh$ are similar to the transmission circuit 1, the step-up circuit 2$a$, the first power supply changeover switch 3, the first driver 4, the second driver 5, and the buffers 6$a$ and 6$b$ in FIG. 1.

However, the transmission circuit 1$h$ internally includes a level shift circuit that changes the reference potential of the signal from the ground potential GND, which is a primary-side reference potential, to a secondary-side reference potential VS (for example, the output potential of the inverter device). Note that the reference potential of the step-up circuit 2$ah$, the first power supply changeover switch 3$h$, the first driver 4$h$, the second driver 5$h$, and the buffers 6$ah$ and 6$bh$ are not the ground potential GND, which is the primary-side reference potential, but the secondary-side reference potential VS.

The input signal IN1$h$ different from the input signal IN1 is input to the semiconductor element driving circuit ICh, and a power supply potential VB of an external power supply 23$h$ is input to the semiconductor element driving circuit ICh. The semiconductor element driving circuit ICh generates a synchronization signal IN2$h$ synchronized with the input signal IN1h, a synchronization signal IN3h synchronized with the synchronization signal IN2h, a signal GEh corresponding to the gate signal of the IGBT 21h, and output signals OUTh1 and OUTh2. In addition, the semiconductor element driving circuit ICh generates a step-up potential VEh higher than the power supply potential VB and a first switch output potential VE1h which is one of the power supply potential VB and the step-up potential VEh.

Summary of Fourth Preferred Embodiment

According to the semiconductor element driving device according to the fourth preferred embodiment as described above, it is possible to realize the HVIC and the half-bridge driver in which the switching loss is reduced and the short circuit tolerance is increased.

Modification of Fourth Preferred Embodiment

Figure 13:
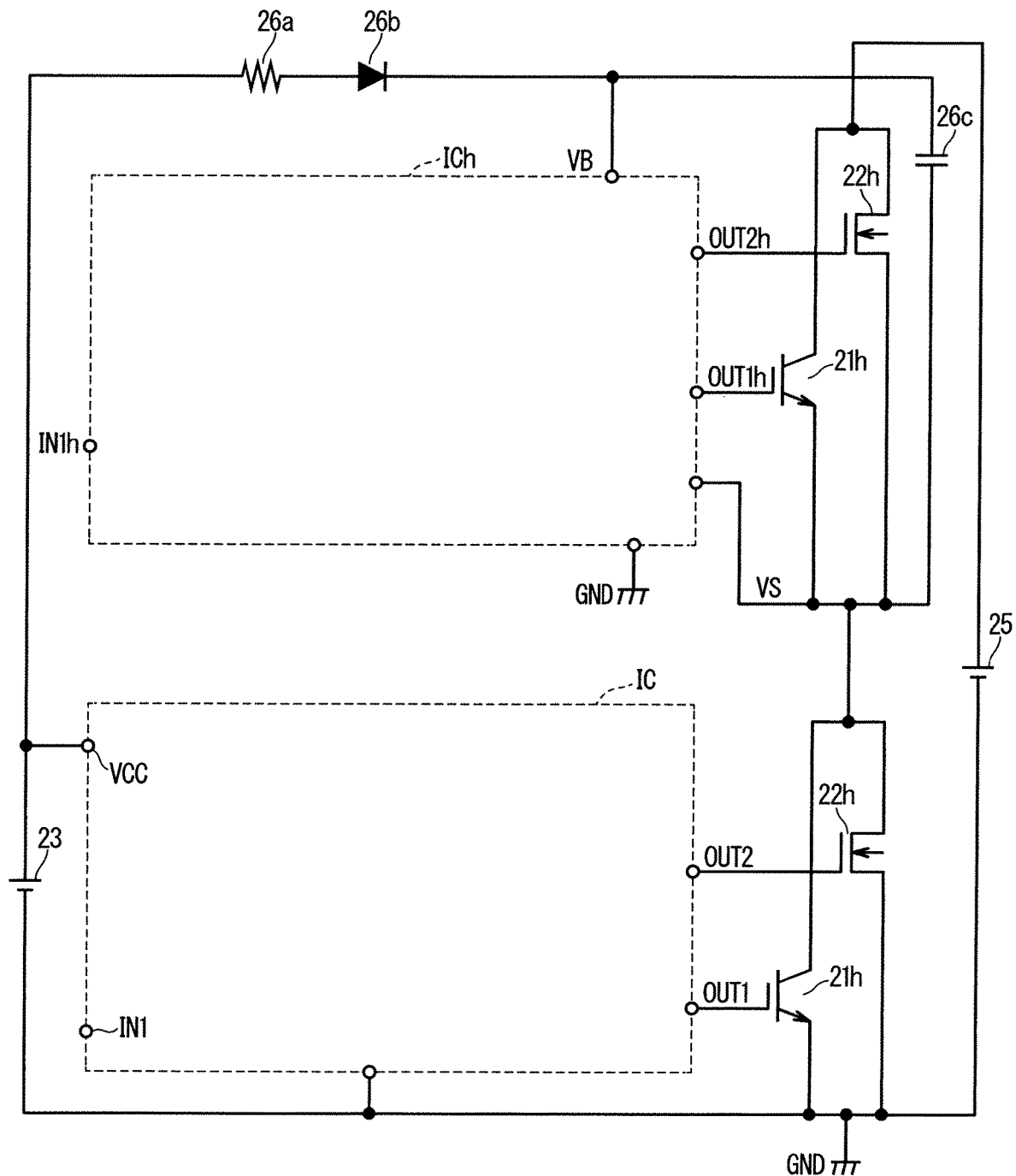
FIG. 13 is a circuit block diagram illustrating the configuration of a semiconductor element driving circuit according to a modification of the fourth preferred embodiment.

In the fourth preferred embodiment, the external power supply 23h is used as a floating power supply of the semiconductor element driving circuit ICh which is the HVIC, but the floating power supply is not limited to this. For example, as illustrated in FIG. 13, as a circuit that generates the floating power supply of the semiconductor element driving circuit ICh, a bootstrap circuit may be provided between the external power supply 23 that is a primary power supply and the secondary-side reference potential VS of the semiconductor element driving circuit ICh. The bootstrap circuit of FIG. 13 includes a resistor 26a, a diode 26b, and a capacitor 26c sequentially connected between the external power supply 23 and the secondary-side reference potential VS. According to such a bootstrap circuit, the capacitor 26c is charged when the power supply potential VB is lower than the power supply potential VCC, so that the power supply potential VB of the semiconductor element driving circuit ICh can be appropriately generated.

Fifth Preferred Embodiment

Figure 14:
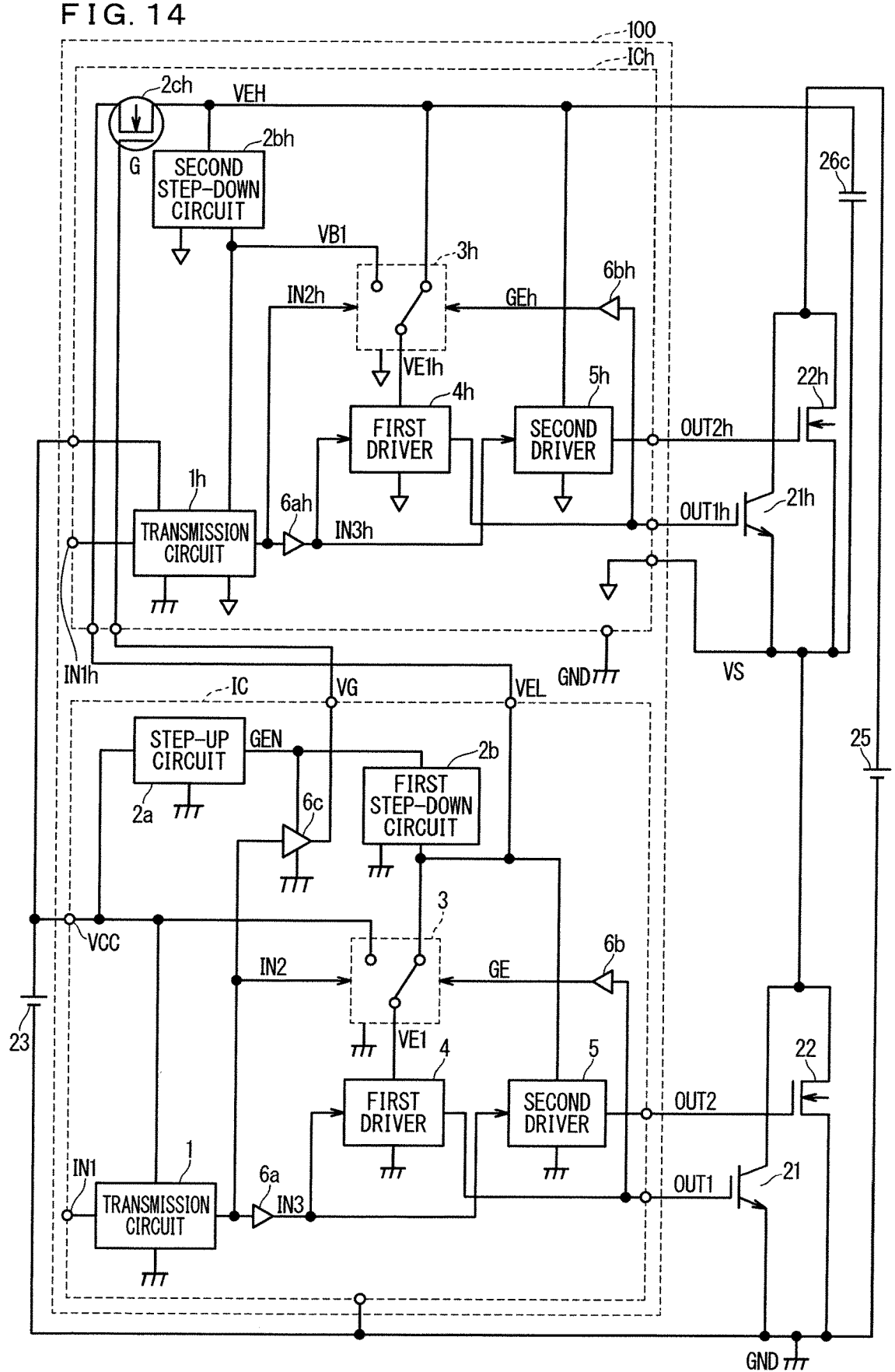
FIG. 14 is a circuit block diagram illustrating the configuration of the semiconductor element driving circuit according to a fifth preferred embodiment.
Figure 15:
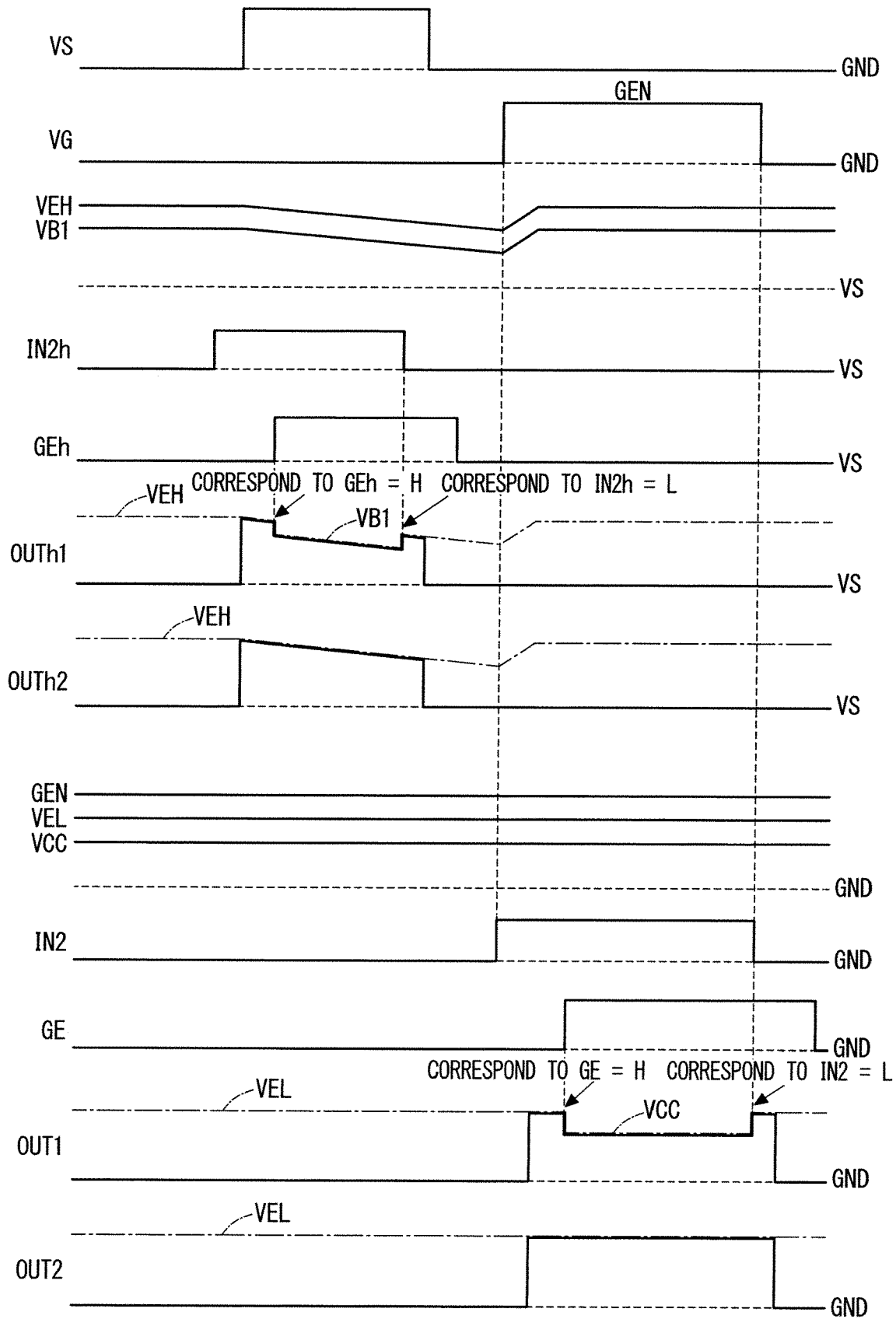
FIG. 15 is a timing chart illustrating the operation sequence of the semiconductor element driving circuit according to the fifth preferred embodiment.

FIG. 14 is a circuit block diagram illustrating a configuration of a semiconductor element driving device 100 according to a fifth preferred embodiment. FIG. 15 is a timing chart illustrating an operation sequence of the semiconductor element driving device 100. In the fifth preferred embodiment, functions of the resistor 26a and the diode 26b of the bootstrap circuit described in the modification of the fourth preferred embodiment are replaced with a high withstand voltage MOSFET. Hereinafter, a configuration using an NMOS for the high withstand voltage MOSFET will be described.

The potential generation circuit of the semiconductor element driving circuit IC that is a primary-side driving circuit includes not only the step-up circuit 2a but also a first step-down circuit 2b.

The step-up circuit 2a generates a step-up potential GEN higher than the power supply potential VCC of the semiconductor element driving circuit IC. The first step-down circuit 2b generates a first step-down potential VEL higher than the power supply potential VCC of the semiconductor element driving circuit IC and lower than the step-up potential GEN, as the generated potential of the semiconductor element driving circuit IC. Thus, the first power supply changeover switch 3 selects and outputs one of the power supply potential VCC and the first step-down potential VEL which is the generated potential, as the first switch output potential VE1, based on the synchronization signal IN2 from the transmission circuit 1 and the signal GE which is the delayed signal.

The semiconductor element driving circuit IC further includes a buffer 6c having a level shift circuit therein. The buffer 6c outputs a signal VG synchronized with the synchronization signal IN2, and having the step-up potential GEN as the high-level potential to the semiconductor element driving circuit ICh.

The potential generation circuit of the semiconductor element driving circuit ICh that is the secondary-side driving circuit includes a second step-down circuit 2bh and an NMOS 2ch that is the high withstand voltage MOSFET.

The signal VG, that is, the step-up potential GEN higher than the power supply potential VCC is input to the gate of the NMOS 2ch. The first step-down potential VEL is input to a source of the NMOS 2ch. The potential of the capacitor 26c, which is a bootstrap capacitor connected to the secondary-side reference potential VS of the semiconductor element driving circuit ICh, is input to a drain of the NMOS 2ch as a power supply potential VEH of the semiconductor element driving circuit ICh. When the gate of the NMOS 2ch receives the signal VG, the NMOS 2ch is turned on, and the capacitor 26c is charged with a charge by the first step-down potential VEL.

The second step-down circuit 2bh generates a second step-down potential VB1 lower than the power supply potential VEH of the semiconductor element driving circuit ICh as the generated potential of the semiconductor element driving circuit ICh. Thus, the first power supply changeover switch 3h selects and outputs one of the power supply potential VEH and the second step-down potential VB1 that is the generated potential, as the second switch output potential VE2, based on the synchronization signal IN2h from the transmission circuit 1h and the signal GE that is the delayed signal.

The operation of semiconductor element driving device 100, which is different from the operation of the first preferred embodiment, will be mainly described with reference to FIG. 15. While the semiconductor element driving circuit ICh which is the HVIC is driven, the charge of the capacitor 26c is consumed, and thus the power supply potential VEH of the semiconductor element driving circuit ICh and the second step-down potential VB1 are reduced.

When the secondary-side reference potential VS is 0 V, the signal VG in which the high-level potential is the step-up potential GEN is input to the gate of the NMOS 2ch, and the capacitor 26c is charged. Thus, the power supply potential VEH of the semiconductor element driving circuit ICh becomes equal to the first step-down potential VEL. Note that FIG. 15 illustrates an example in which the power supply potential VCC, the first step-down potential VEL, and the step-up potential GEN have sufficient current capability, and these potentials are not reduced even when the semiconductor element driving circuit IC, which is the primary-side driving circuit, is driven.

<Configuration Example of First Step-Down Circuit 2b and Second Step-Down Circuit 2bh>

Figure 16:
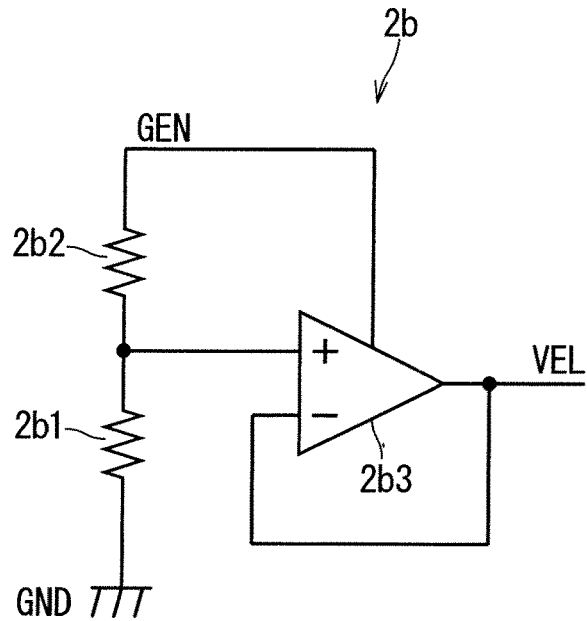
FIG. 16 is a circuit diagram illustrating a configuration example of a first step-down circuit.

FIG. 16 is a circuit diagram illustrating a configuration example of the first step-down circuit 2b. The first step-down circuit 2b includes resistors 2b1 and 2b2 and an operational amplifier 2b3. A divided voltage of the step-up potential GEN by the resistors 2b1 and 2b2 is input to the operational amplifier 2b3 constituting a voltage follower circuit, and thus the first step-down potential VEL lower than the step-up potential GEN is generated.

Figure 17:
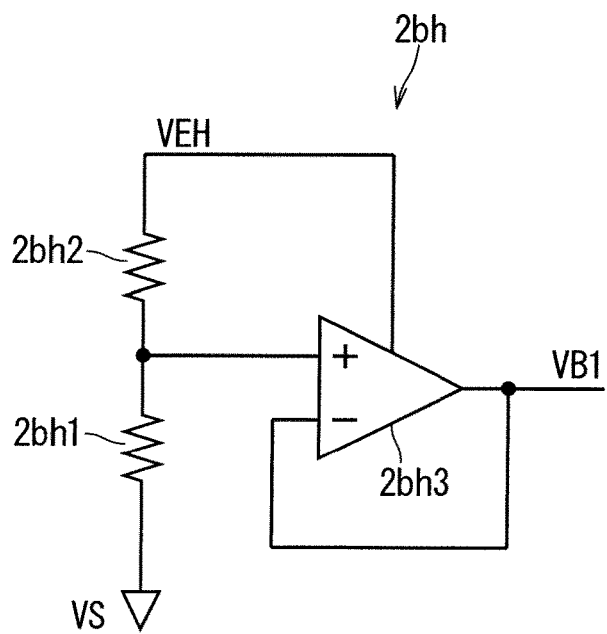
FIG. 17 is a circuit diagram illustrating a configuration example of a second step-down circuit.

FIG. 17 is a circuit diagram illustrating a configuration example of the second step-down circuit 2*bh*. Similarly to the first step-down circuit 2*b*, the second step-down circuit 2*bh* includes resistors 2*bh*1 and 2*bh*2, and an operational amplifier 2*bh*3, and thus the second step-down potential VB1 lower than the power supply potential VEH is generated.

Note that the configuration of the first step-down circuit 2*b* and the second step-down circuit 2*bh* is not limited to the above, and may be configured by a general series regulator.

Summary of Fifth Preferred Embodiment

According to the semiconductor element driving device 100 of the fifth preferred embodiment as described above, since the step-up potential GEN obtained by boosting the power supply potential VCC by the step-up circuit 2*a* is used in the semiconductor element driving circuits IC and ICh, the step-up circuit can be made common in the semiconductor element driving circuits IC and ICh.

In addition, in the bootstrap circuit, since the power supply potential VEH of the semiconductor element driving circuit ICh, that is, a secondary power supply is generated from the first step-down potential VEL, the step-up circuit in the semiconductor element driving circuit ICh which is the HVIC is not necessary. Since the first step-down circuit 2*b* and the second step-down circuit 2*bh* are generally smaller than the step-up circuit, a circuit scale can be reduced according to the fifth preferred embodiment.

Modification of Fourth and Fifth Preferred Embodiments

The half-bridge driver including the semiconductor element driving circuits IC and ICh of the fourth and fifth preferred embodiments may be included in a three-phase bridge driver. In this configuration, since three semiconductor element driving circuits IC, which are three primary-side driving circuits, are provided, there are three step-up circuits 2*a* and three first step-down circuits 2*b*, but they may be respectively integrated into one step-up circuit 2*a* and one first step-down circuit 2*b*. The reference potential of the primary-side driving circuit of each phase is common to the ground potential GND, and the circuits can be integrated and shared, so that the circuit scale can be reduced.

Note that in the above description, the fourth and fifth preferred embodiments are applied to the configuration of the first preferred embodiment, but is not limited thereto, and for example, the fourth and fifth preferred embodiments may be applied to the configurations of the second and third preferred embodiments. Further, in the fourth preferred embodiment, the half-bridge driver including the semiconductor element driving circuits IC and ICh is described, but is not limited thereto, and for example, a full-bridge driver including the semiconductor element driving circuits IC and ICh may be used. Further, the full-bridge driver may be included in the three-phase bridge driver. Furthermore, the semiconductor element driving devices according to the fourth and fifth preferred embodiments may be included in a system having an inductive load (for example, a motor or the like) driven by the inverter.

Note that the preferred embodiments and the modifications can be freely combined, and the preferred embodiments and the modifications can be appropriately modified or omitted.

While the disclosure has been shown and described in detail, the foregoing description is in all aspects illustrative and not restrictive. It is therefore understood that numerous modifications and variations can be devised.

What is claimed is:

1. A semiconductor element driving circuit that drives a bipolar transistor element and a unipolar transistor element, the semiconductor element driving circuit comprising:
   a transmission circuit that generates a synchronization signal synchronized with an input signal based on the input signal;
   a potential generation circuit that generates a potential different from a power supply potential as a generated potential based on the power supply potential;
   a first switch that selects and outputs one of the power supply potential and the generated potential as a first switch output potential, based on the synchronization signal from the transmission circuit and a delayed signal delayed from the synchronization signal, wherein the power supply potential and the generated potential are individually and simultaneously input to the first switch;
   a first driver that charges a gate of the bipolar transistor element based on the synchronization signal of the transmission circuit and the first switch output potential; and
   a second driver that charges a gate of the unipolar transistor element based on the synchronization signal of the transmission circuit and one of the power supply potential and the generated potential.

2. The semiconductor element driving circuit according to claim 1, wherein
   the potential generation circuit includes a step-up circuit that generates a step-up potential higher than the power supply potential as the generated potential,
   the delayed signal includes a gate signal from the gate of the bipolar transistor element, and
   the second driver charges the gate of the unipolar transistor element based on the synchronization signal of the transmission circuit and the generated potential.

3. The semiconductor element driving circuit according to claim 1, wherein
   the potential generation circuit includes a step-up circuit that generates a step-up potential higher than the power supply potential as the generated potential,
   the semiconductor element driving circuit further comprises:
   a temperature sensor that outputs, as a sensor output potential, a potential lower than the step-up potential and having negative temperature dependency, based on a temperature of the semiconductor element driving circuit; and
   a clamp circuit that outputs the sensor output potential when the sensor output potential is equal to or higher than the power supply potential, and outputs the power supply potential when the sensor output potential is lower than the power supply potential, and
   the first switch selects and outputs one of the potential output from the clamp circuit and the generated potential as the first switch output potential, based on the synchronization signal and the delayed signal.

4. A semiconductor element driving circuit that drives a bipolar transistor element and a unipolar transistor element, the semiconductor element driving circuit comprising:
   a transmission circuit that generates a synchronization signal synchronized with an input signal based on the input signal;

a potential generation circuit that generates a potential different from a power supply potential as a generated potential based on the power supply potential;

a first switch that selects and outputs one of the power supply potential and the generated potential as a first switch output potential, based on the synchronization signal from the transmission circuit and a delayed signal delayed from the synchronization signal;

a first driver that charges a gate of the bipolar transistor element based on the synchronization signal of the transmission circuit and the first switch output potential;

a second driver that charges a gate of the unipolar transistor element based on the synchronization signal of the transmission circuit and one of the power supply potential and the generated potential;

an overcurrent detection circuit that detects presence or absence of an overcurrent in the bipolar transistor element and the unipolar transistor element; and a second switch that selects and outputs one of the power supply potential and the generated potential as a second switch output potential based on a detection result of the overcurrent detection circuit, wherein the second driver charges the gate of the unipolar transistor element, based on the synchronization signal of the transmission circuit and the second switch output potential which is one of the power supply potential and the generated potential.

5. The semiconductor element driving circuit according to claim 1, wherein the semiconductor element driving circuit is an HVIC.

6. The semiconductor element driving circuit according to claim 1, wherein the semiconductor element driving circuit is included in a half-bridge driver.

7. The semiconductor element driving circuit according to claim 1, wherein the semiconductor element driving circuit is included in a three-phase bridge driver.

8. A semiconductor element driving device comprising:
a primary-side driving circuit that is the semiconductor element driving circuit according to claim 1, and drives a lower arm; and
a secondary-side driving circuit that is the semiconductor element driving circuit according to claim 1, and drives an upper arm, wherein
the potential generation circuit of the primary-side driving circuit includes:

a step-up circuit that generates a step-up potential higher than the power supply potential of the primary-side driving circuit; and a first step-down circuit that generates, as the generated potential of the primary-side driving circuit, a first step-down potential that is higher than the power supply potential of the primary-side driving circuit and lower than the step-up potential, and the potential generation circuit of the secondary-side driving circuit includes:

a MOSFET having a gate to which the step-up potential is input, a source to which the first step-down potential is input, and a drain to which a potential of a bootstrap capacitor connected to a reference potential of the secondary-side driving circuit is input as the power supply potential of the secondary-side driving circuit; and a second step-down circuit that generates a second step-down potential lower than the power supply potential of the secondary-side driving circuit as the generated potential of the secondary-side driving circuit.

9. A semiconductor element driving circuit that drives a bipolar transistor element and a unipolar transistor element, the semiconductor element driving circuit comprising:

a transmission circuit that generates a synchronization signal synchronized with an input signal based on the input signal;

a potential generation circuit that generates a potential different from a power supply potential as a generated potential based on the power supply potential;

a first switch that selects and outputs one of the power supply potential and the generated potential as a first switch output potential, based on the synchronization signal from the transmission circuit and a delayed signal delayed from the synchronization signal;

a first driver that charges a gate of the bipolar transistor element based on the synchronization signal of the transmission circuit and the first switch output potential; and a second driver that charges a gate of the unipolar transistor element based on the synchronization signal of the transmission circuit and one of the power supply potential and the generated potential, wherein the potential generation circuit generates the generated potential based on the power supply potential, independently from the synchronization signal and the delayed signal.

\* \* \* \* \*